United States Patent
Basker et al.

(10) Patent No.: US 9,105,742 B1
(45) Date of Patent: Aug. 11, 2015

(54) DUAL EPITAXIAL PROCESS INCLUDING SPACER ADJUSTMENT

(71) Applicant: International Business Machines Corporation, Armonk, NY (US)

(72) Inventors: Veeraraghavan S. Basker, Schenectady, NY (US); Jeffrey B. Johnson, Essex Junction, VT (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 14/227,267

(22) Filed: Mar. 27, 2014

(51) Int. Cl.
| | |
|---|---|
| H01L 21/336 | (2006.01) |
| H01L 29/76 | (2006.01) |
| H01L 21/8234 | (2006.01) |
| H01L 27/088 | (2006.01) |
| H01L 29/66 | (2006.01) |
| H01L 29/08 | (2006.01) |

(52) U.S. Cl.
CPC ...... *H01L 21/823418* (2013.01); *H01L 21/823456* (2013.01); *H01L 21/823468* (2013.01); *H01L 27/088* (2013.01); *H01L 29/0843* (2013.01); *H01L 29/66545* (2013.01)

(58) Field of Classification Search
CPC .............. H01L 21/823418; H01L 21/823456; H01L 21/823468; H01L 27/088; H01L 29/66545; H01L 29/0843
USPC ................. 438/275, 283, 286, 303, 587, 595; 257/401
See application file for complete search history.

(56) References Cited

U.S. PATENT DOCUMENTS

| | | | |
|---|---|---|---|
| 4,956,314 | A | 9/1990 | Tam et al. |
| 6,344,396 | B1 | 2/2002 | Ishida et al. |
| 6,429,083 | B1 | 8/2002 | Ishida et al. |
| 6,756,277 | B1 | 6/2004 | Yu |
| 7,537,988 | B2 | 5/2009 | Ekbote et al. |
| 2006/0131656 | A1* | 6/2006 | Shin et al. ............ 257/369 |
| 2011/0101455 | A1 | 5/2011 | Basker et al. |
| 2012/0313178 | A1* | 12/2012 | Liao et al. ............ 257/368 |
| 2013/0009251 | A1 | 1/2013 | Jain |
| 2014/0374840 | A1* | 12/2014 | Lee et al. ............. 257/401 |

OTHER PUBLICATIONS

Matsukawa et al., "Variability origins of parasitic resistance in FinFETs with silicided source/drain," IEEE Electron Device Letters, vol. 33, No. 4, 2012, pp. 474-476.
Roy et al., "Double-gate SOI devices for low-power and high-performance applications," 19th International Conference on VLSI Design, held jointly with 5th International Conference on Embedded Systems and Design, 2006, 8 pages.
Weng, "Optimization of sub-100nm transistor gate sidewall spacer process for high-performance applications," IEEE International Conference of Electron Devices and Solid-State Circuits, EDSSC, 2009., pp. 50-53.

* cited by examiner

*Primary Examiner* — Kevin M Picardat
(74) *Attorney, Agent, or Firm* — Cantor Colburn LLP; Vazken Alexanian

(57) ABSTRACT

A multi-gate semiconductor device includes a first semiconductor structure and a second semiconductor structure. The first semiconductor structure includes a first gate stack having first spacers formed on opposing sides thereof. The second semiconductor structure includes a second gate stack having second spacers formed on opposing sides thereof. First elevated source/drain regions abut the first spacers to define a first effective S/D distance between the first gate stack and the first elevated source/drain regions. Second elevated source/drain regions abut the second spacers to define a second effective S/D distance between the second gate stack and the second elevated source/drain regions. The second effective S/D distance is equal to the first effective S/D distance.

16 Claims, 16 Drawing Sheets

DUAL EPITAXIAL PROCESS INCLUDING SPACER ADJUSTMENT

BACKGROUND

The present invention relates to semiconductor device fabrication, and in particular, to elevated source/drain (ESD) semiconductor devices.

As semiconductor devices continue to be scaled down, various methods have been relied upon for preserving the channel length. A minimum channel length (Lmin) may be determined, which indicates the minimum length at which a channel may be formed before observing short-channel effects in the semiconductor device. The junction depth of the semiconductor device affects the minimum channel length. Thus, reducing the junction depth may allow for reducing the channel length while mitigating short-channel effects. However, reducing the junction depth may lead to an increase in intrinsic parasitic series resistances and undesirable junction leakage currents.

Conventional methods have relied upon elevating the source/drain regions to counter the effects that occur when reducing the junction depths. The elevated source/drain regions are typically formed by selectively growing an epitaxial (epi) structure over the source and drain regions. The epi structure forms an effective junction depth that is reduced according to the extent of the elevation without realizing an increase of intrinsic parasitic series resistances and undesirable junction leakage currents.

When fabricating semiconductor devices having two different doped channel regions (e.g., a p-type doped channel region and an n-type doped channel region) on a common substrate layer, separate epi growth processes (i.e., a dual epi process) must be used. The dual epi process, however, forms spacers on a first gate stack (a p-type semiconductor gate stack) having a greater thickness than spacers on a second gate stack (an n-type semiconductor gate stack). The thicker spacers cause the corresponding epi structure (i.e., the elevated S/D region) to be formed further away from the gate stack. The increased distance (i.e., the effective S/D distance) between the elevated S/D region and the corresponding gate stack inhibits doped ions of the epi structures from diffusing beneath the gate stack.

SUMMARY

According to one exemplary embodiment, a multi-gate semiconductor device comprises a first semiconductor structure and a second semiconductor structure. The first semiconductor structure includes a first gate stack having first spacers formed on opposing sides thereof. The second semiconductor structure includes a second gate stack having second spacers formed on opposing sides thereof. First elevated source/drain regions abut the first spacers to define a first effective S/D distance between the first gate stack and the first elevated source/drain regions. Second elevated source/drain regions abut the second spacers to define a second effective S/D distance between the second gate stack and the second elevated source/drain regions. The second effective S/D distance is equal to the first effective S/D distance.

According to another exemplary embodiment, a method of forming a multigate semiconductor device comprising forming a first semiconductor structure on a semiconductor substrate. The first semiconductor structure includes a first dummy gate and first spacers having a first spacer width. The method further comprises forming a second semiconductor structure on the semiconductor substrate. The second semiconductor structure includes a second dummy gate and second spacers having a second spacer width that is greater than the first spacer width. The method further comprises selectively etching the second spacers to reduce the second spacer width such that a second gate width of the second semiconductor structure is increased.

Additional features are realized through the techniques of the present invention. Other exemplary embodiments are described in detail herein and are considered a part of the claimed invention. For a better understanding of the invention with and the features, refer to the description and to the drawings.

BRIEF DESCRIPTION OF THE SEVERAL VIEWS OF THE DRAWINGS

The subject matter which is particularly pointed out and distinctly claimed in the claims at the conclusion of the specification. The forgoing and other features are apparent from the following detailed description taken in conjunction with the accompanying drawings in which:

DETAILED DESCRIPTION

Figure 1:
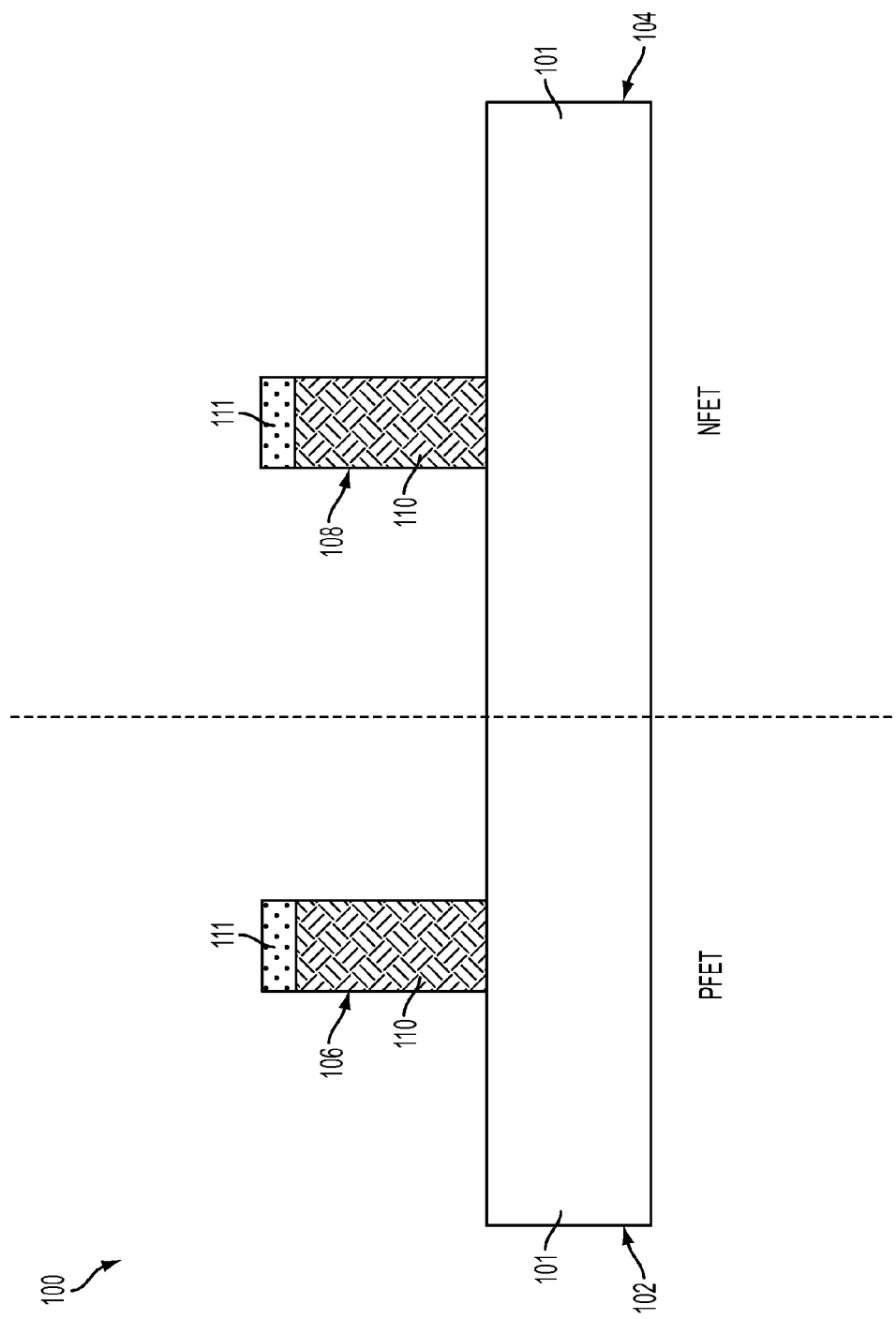
FIG. 1 illustrates a semiconductor device including a first semiconductor structure and a second semiconductor structure formed on a substrate.

Turning to FIG. 1, an exemplary embodiment of a semiconductor device 100 is illustrated. The semiconductor device 100 includes a substrate 101 having a first semiconductor structure 102 and a second semiconductor structure 104 formed thereon. The first semiconductor structure 102 may include a p-type field effect transistor (PFET) and the second semiconductor structure 104 may include an n-type field effect transistor (NFET). The first semiconductor structure 102 includes a first gate stack 106 and the second semiconductor structure 104 includes a second gate stack 108. The substrate 101 may be formed from a semiconductor material such as, for example, silicon (Si).

The first gate stack 106 may be formed on an n-type doped channel region, while the second gate stack 108 may be formed on an p-type doped channel region, as understood by those ordinarily skilled in the art. The n-type channel region may be formed by doping the substrate 101 with, for example, phosphorus (P) and arsenic (As). The p-type channel region may be formed by doping the substrate 101 with boron (B), for example. The n-type doped channel region and/or the p-type doped channel region may form respective doped wells in the substrate 101. The gate stacks may be formed over a respective doped-well to form the gate channel region corresponding to a respective PFET or NFET as understood by those ordinarily skilled in the art.

Each of the first gate stack 106 and the second gate stack 108 includes a respective dummy gate structure 110. The dummy gate structure 110 may be subsequently replaced according to a metal-gate replacement process as understood by those of ordinary skill in the art. The dummy gate structure 110 may be formed from a polysilicon material, for example. The dummy gate structure 110 may further include a nitride mask 111. The nitride mask 111 may protect the underlying dummy gate structure 110 during fabrication of the semiconductor device 100.

Figure 2:
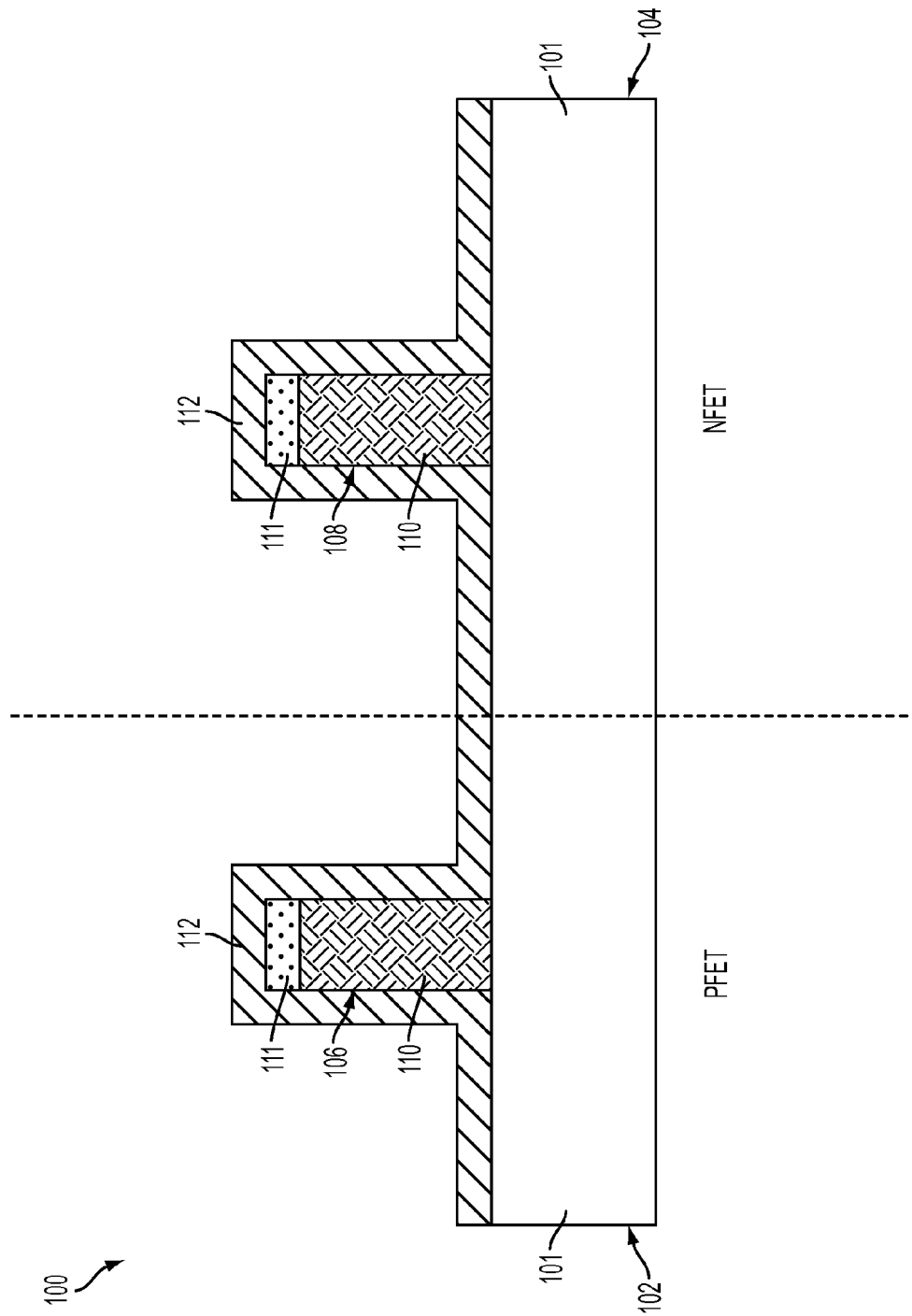
FIG. 2 illustrates the semiconductor device of FIG. 1 following deposition of a first spacer layer on the first and second semiconductor structures.

With reference now to FIG. 2, a first spacer layer 112 is deposited over the first gate stack 106 and the second gate stack 108. The first spacer layer 112 may be formed from a silicon nitride (SiN) material, for example, as understood by those ordinarily skilled in the art. According to at least one exemplary embodiment, the first spacer layer 112 may have a thickness of 10 nanometers (nm), for example.

Figure 3:
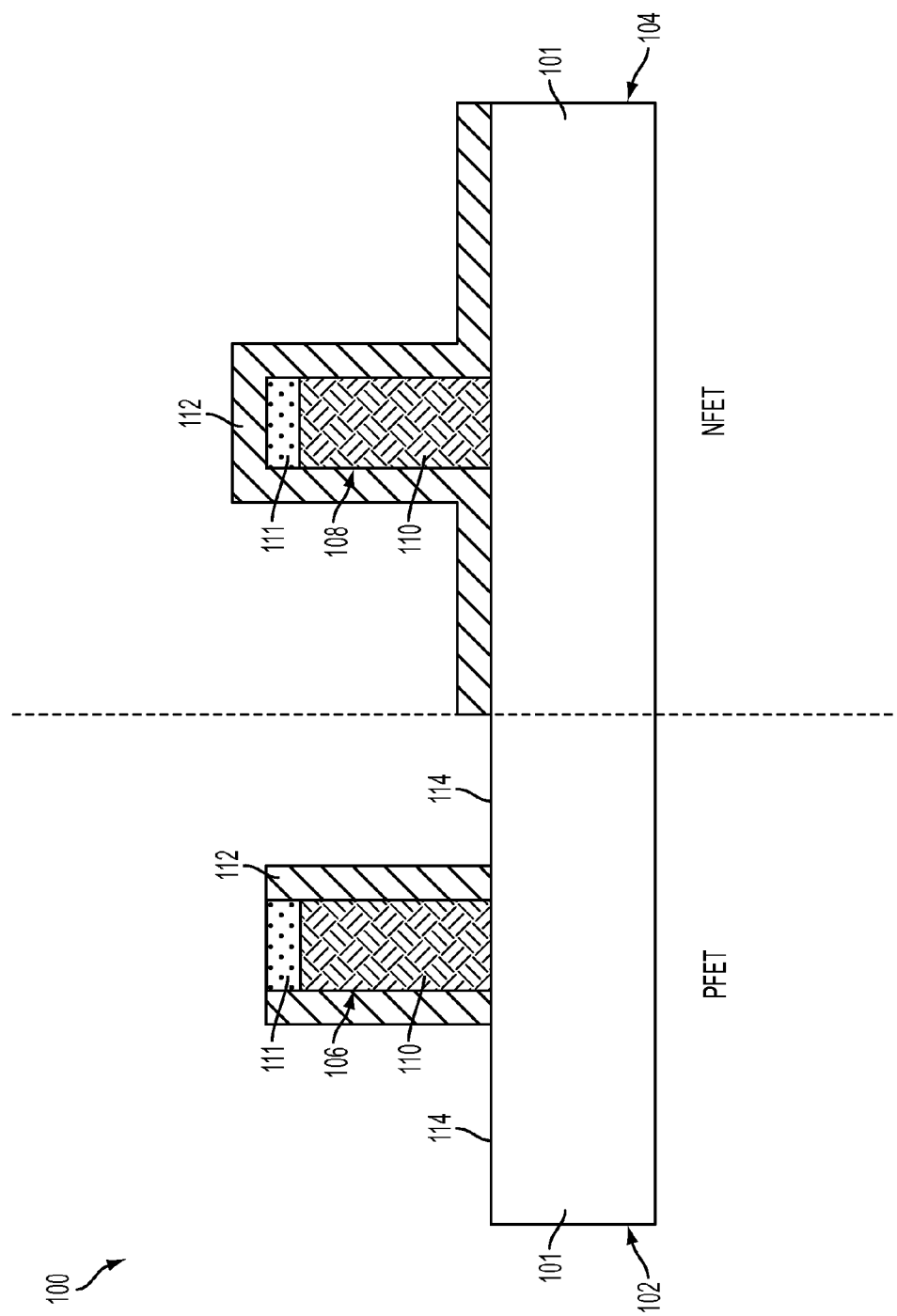
FIG. 3 illustrates the semiconductor device of FIG. 2 following an etching process that etches a portion of the first spacer layer deposited on the first semiconductor structure to form first spacers.

Turning to FIG. 3, the first spacer layer 112 corresponding to the first semiconductor structure 102 is selectively etched to expose underlying source/drain regions 114. Various lithographic patterning and chemical etching processes may be used to selectively etch the first spacer layer 112 as understood by those ordinarily skilled in the art.

Figure 4:
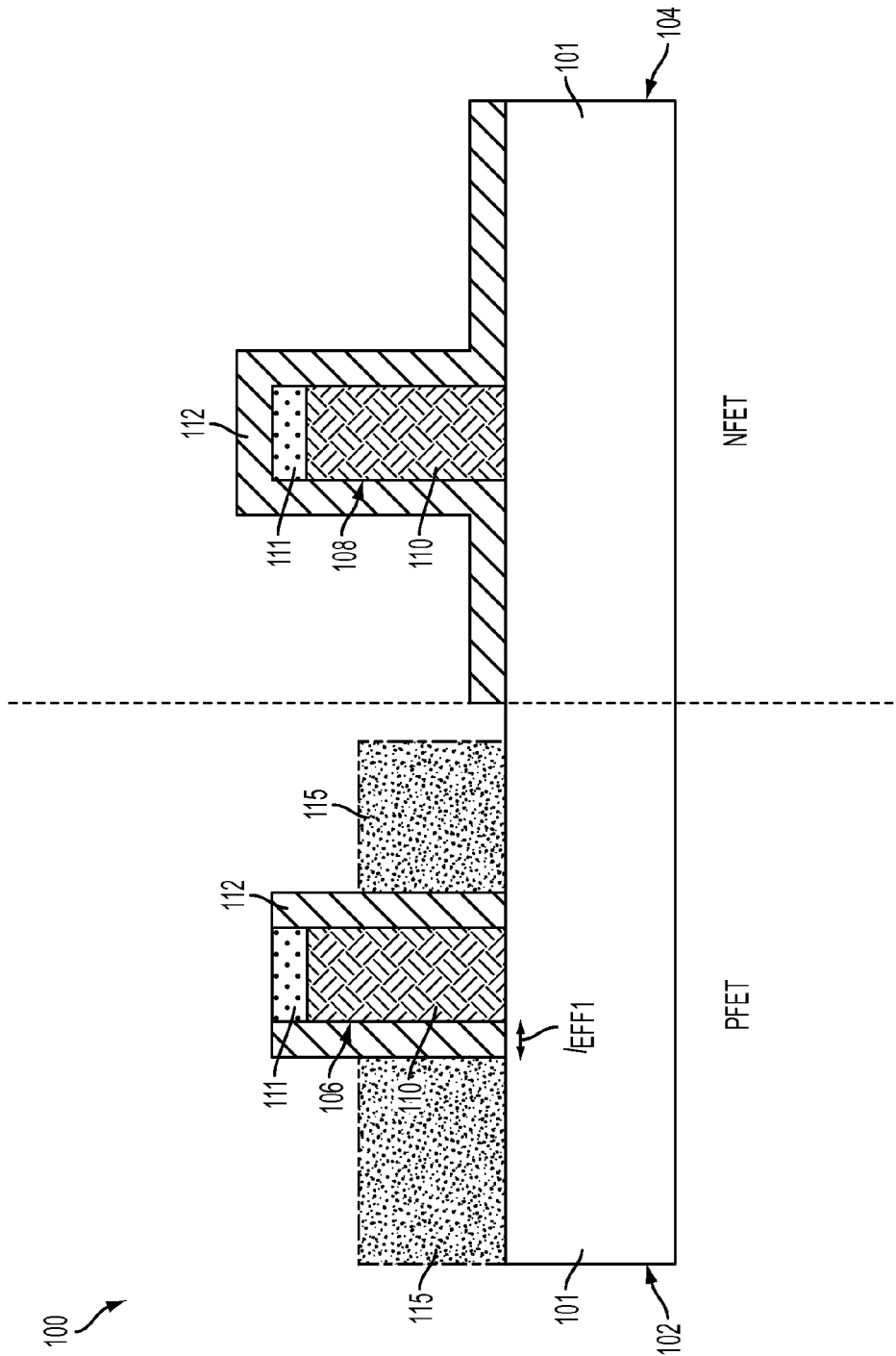
FIG. 4 illustrates the semiconductor device of FIG. 3 following growth of first epitaxial structures that form first elevated source/drain regions abutting first spacers of the first semiconductor structure.

Referring to FIG. 4, first epi structures 115 are grown from the exposed source/drain (S/D) regions 114. According to one example, the first epi structures 115 are grown using a doped p-type epitaxial crystalline material, as understood by those ordinary skilled in the art. The first epi structures 115 form elevated S/D regions that abut the first spacer layer 112 of the first gate stack 106. The distance between an S/D region and a respective gate stack defines an effective S/D length. For example, the distance between the first epi structures 115 and the first gate stack 106 defines a first effective S/D distance ($Leff_1$). Although the first epi structures 115 are grown using a doped p-type epitaxial crystalline material, a doped n-type epitaxial crystalline material may be used when forming epi structures of the second semiconductor structure 104, as discussed in greater detail below. It is also appreciated that the first epi structures 115 may be grown undoped, and subsequently implanted with ion species such as boron (B), arsenide (As) or phosphorous (P) followed by a rapid thermal annealing to activate the implanted dopants.

Figure 5:
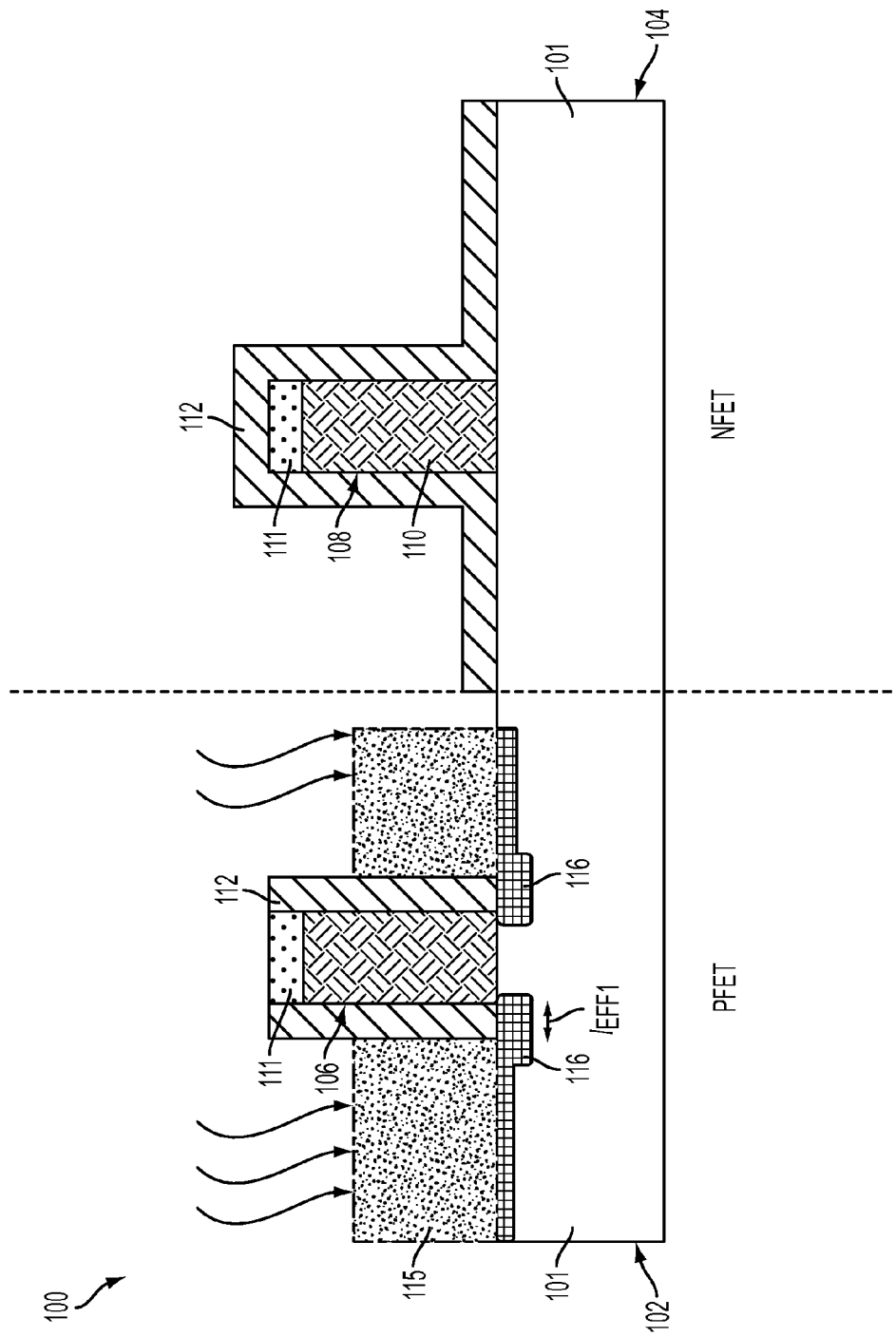
FIG. 5 illustrates the semiconductor device of FIG. 4 showing an annealing process applied to the first epitaxial structures that diffuses ions into the substrate to form first extension overlaps.

Referring now to FIG. 5, an anneal operation is applied to the first epi structures 115. The anneal operation causes the dopant of the first epi structures 115 to diffuse through the substrate 101 and into the respective gate channel region. Accordingly, first S/D junction overlaps 116 are formed beneath the first epi structure 115 and the first spacers 112 to extend beneath (i.e., overlap) the first gate stack 106. The first junction overlap 116 is configured to control resistance (e.g., reduce resistance) between the respective elevated S/D regions formed by the first epi structures 115, and the respective gate channel of the first semiconductor structure 102.

Figure 6:
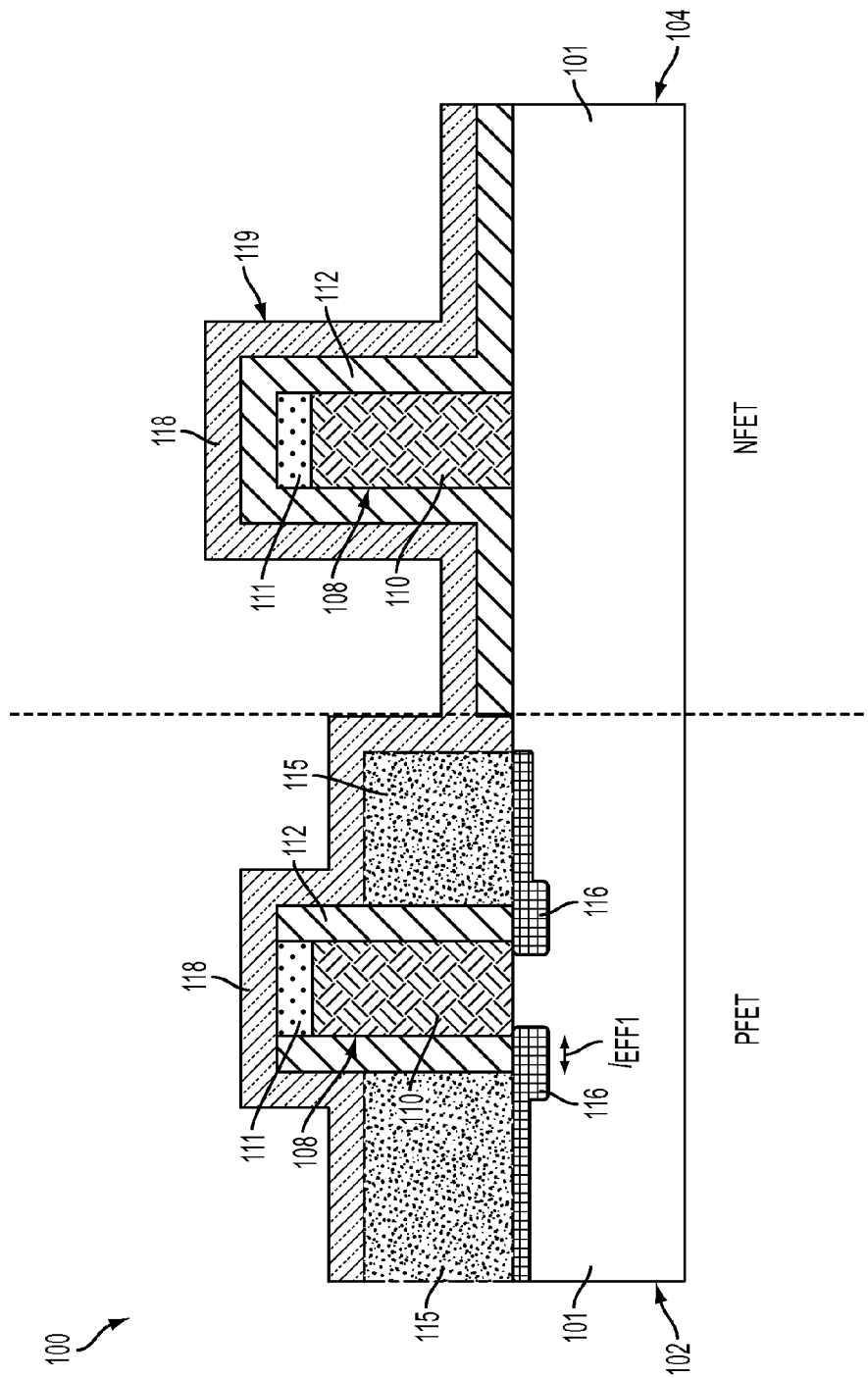
FIG. 6 illustrates the semiconductor device of FIG. 5 following deposition of a second spacer layer that covers the first epitaxial structures and etched spacers of the first semiconductor structure and forms a dual-spacer layer on the second semiconductor structure.

Turning to FIG. 6, a second spacer layer 118 is deposited on the first semiconductor structure 102 and the second semiconductor structure 104. With respect to the first semiconductor structure 102, the second spacer layer 118 covers the first gate stack 106, a portion of the first spacer layer 112, and the first epi structures 115. With respect to the second semiconductor structure 104, the second spacer layer 118 is formed on the upper surface of the first spacer layer 112 which covers the second gate stack 108 and the underlying substrate 101. The second spacer layer 118 is configured to protect the first epi structures 115 from additional epi growth during a second epi structure deposition process, which is discussed in greater detail below. The second spacer layer 118 may be formed from a silicon nitride (SiN) material, for example, as understood by those ordinarily skilled in the art. The second spacer layer 118 may also have a thickness, for example, of 3 nm. As further illustrated in FIG. 5, the combination of the first spacer layer 112 and the second spacer layer 118 results in the formation of a dual-spacer layer 119. Accordingly, the thickness of the dual-spacer layer 119 may be, for example, 13 nm (i.e., the thickness of the first spacer layer 112 combined with the thickness of the second spacer layer 118).

Figure 7:
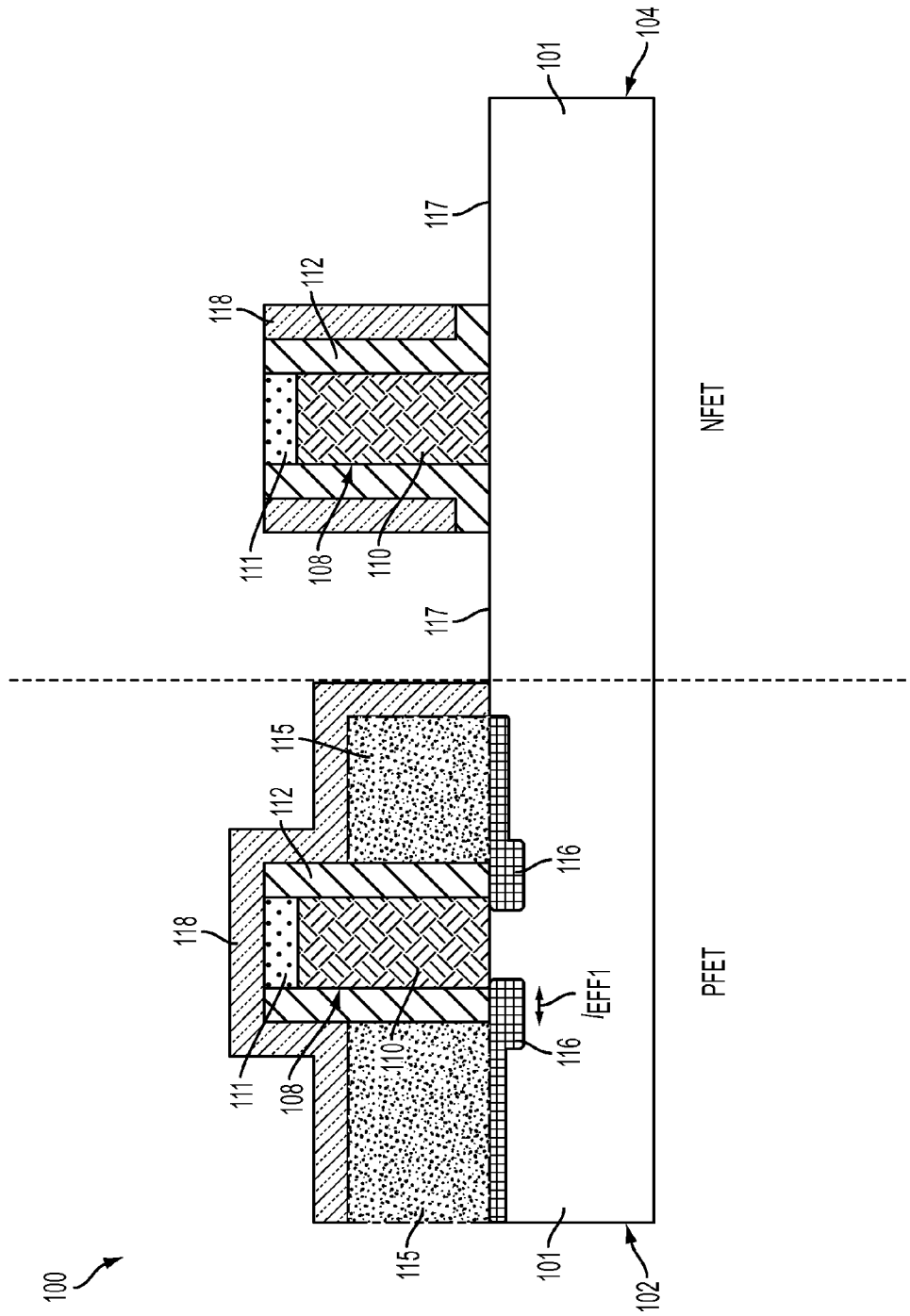
FIG. 7 illustrates the semiconductor device of FIG. 6 following an etching process that etches the dual-spacer layer to form dual spacers of the second semiconductor structure.

With respect to the second semiconductor structure 104, the dual-spacer layer 119, i.e., each of the first spacer layer 112 and the second spacer layer 118 is etched to expose the underlying S/D regions 117 as illustrated in FIG. 7. Various chemical etching processes may be used to selectively etch the first spacer layer 112 and second spacer layer 118 as understood by those ordinarily skilled in the art.

Figure 8:
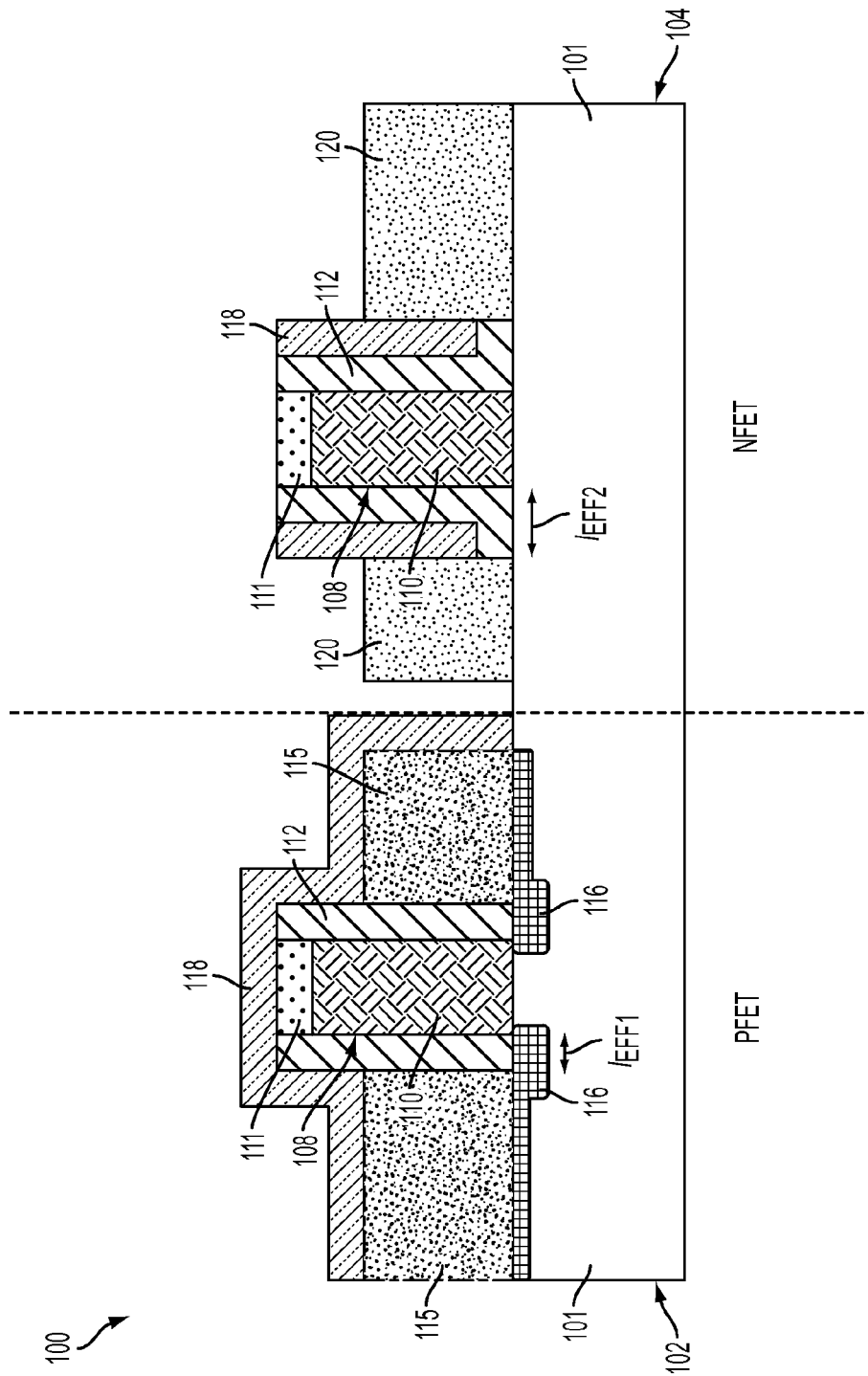
FIG. 8 illustrates the semiconductor device of FIG. 7 following growth of second epitaxial structures that form second elevated source/drain regions abutting the dual-spacers of the second semiconductor structure.

Turning to FIG. 8, second epi structures 120 are formed on the exposed source/drain (S/D) regions 117 of the second semiconductor structure 104. The second epi structures 120 are grown using a doped n-type epitaxial crystalline material, as understood by those ordinary skilled in the art. It is also appreciated that the second epi structures 120 may be grown undoped, and subsequently implanted with ion species such as boron (B), arsenide (As) or phosphorous (P) followed by a rapid thermal annealing to activate the implanted dopants.

As further illustrated in FIG. 8, the second epi structures 120 form elevated S/D regions that abut the dual-spacer layer 119 of the second gate stack 108 to define a second effective S/D distance ($Leff_2$). The increased thickness of the dual-spacer layer 119 further separates the second epi structures 120 (i.e., the elevated S/D regions) of the second semiconductor structure 104 away from the second gate stack 108. As a result, the effective S/D distance (Leff$_2$) of the second semiconductor structure 104 is greater than the first effective S/D distance (Leff$_1$) of the first semiconductor structure 102.

Figure 9:
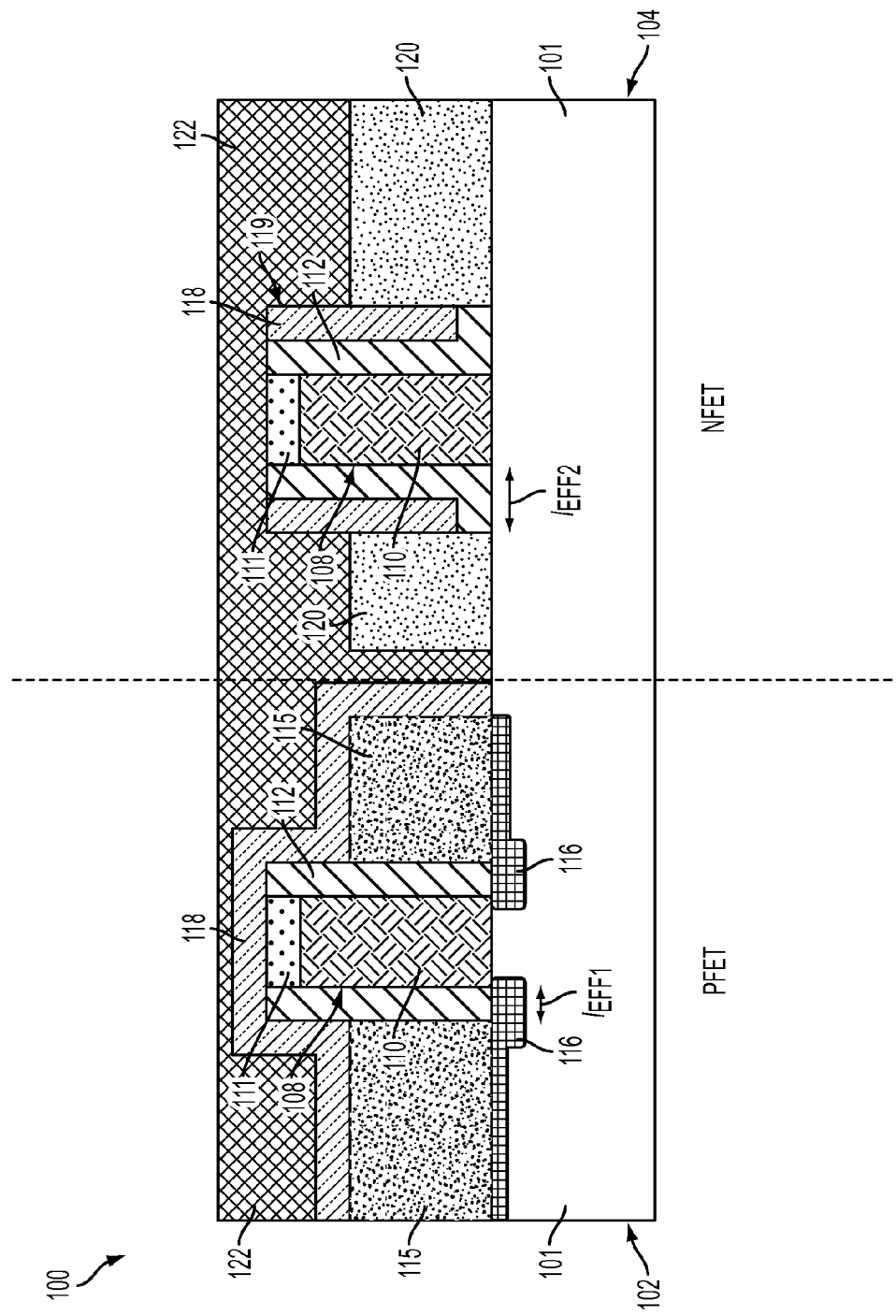
FIG. 9 illustrates the semiconductor device of FIG. 8 following deposition a flowable oxide layer that covers the first and second semiconductor structures.

To reduce Leff$_2$, at least one exemplary embodiment provides a feature of adjusting the width of the dual-spacer layer 119 corresponding to the second semiconductor structure 104. Referring to FIG. 9, for example, a flowable oxide 122 is deposited over the first semiconductor structure 102 and the second semiconductor structure 104 to protect the first epi structures 115 and the second epi structures 118. The flowable oxide 122 may be formed from various material including, but not limited to, a silicon-containing hydrocarbon compound such as, for example, SiOCxHy. The flowable oxide 122 may also be formed as a SiOCxHy film that has excellent gap fill capability typically used for interlayer dielectric.

Figure 10:
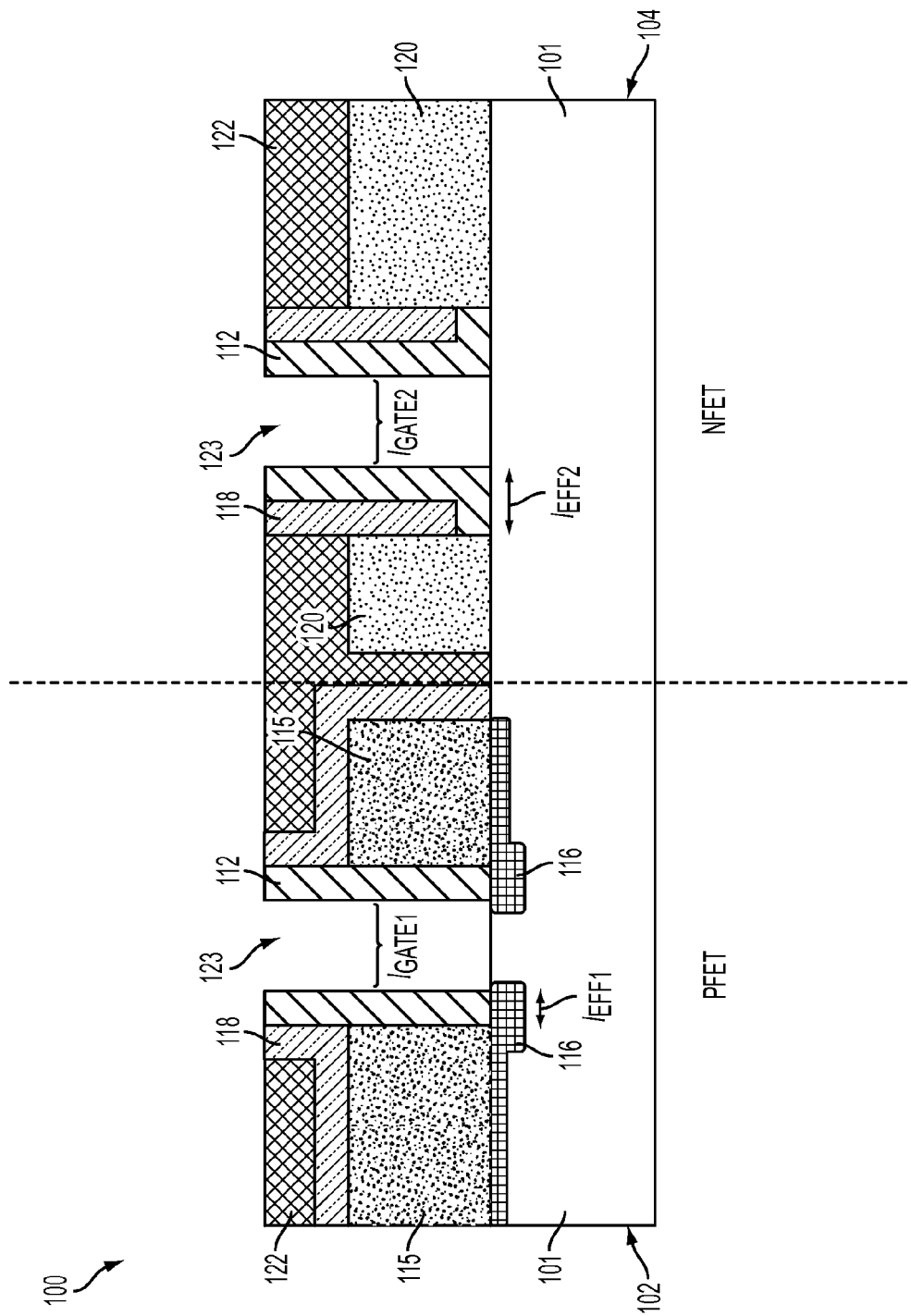
FIG. 10 illustrates the semiconductor device of FIG. 9 following removal of a dummy gate structure to form a first void in the first semiconductor structure and a second void in the second semiconductor structure.

Turning to FIG. 10, the dummy gate structure 110 corresponding to each of the first gate stack 106 and the second gate stack 108 is removed, which forms voids 123 between the first space layers 112. The voids 123 define a first gate length ($l_{GATE1}$) of the first gate stack 106 and a second gate length ($l_{GATE2}$) of the second gate stack 108. A replacement gate (not shown) may be subsequently formed in the voids 123 according to a metal-gate replacement process, as discussed in greater detail below.

Figure 11:
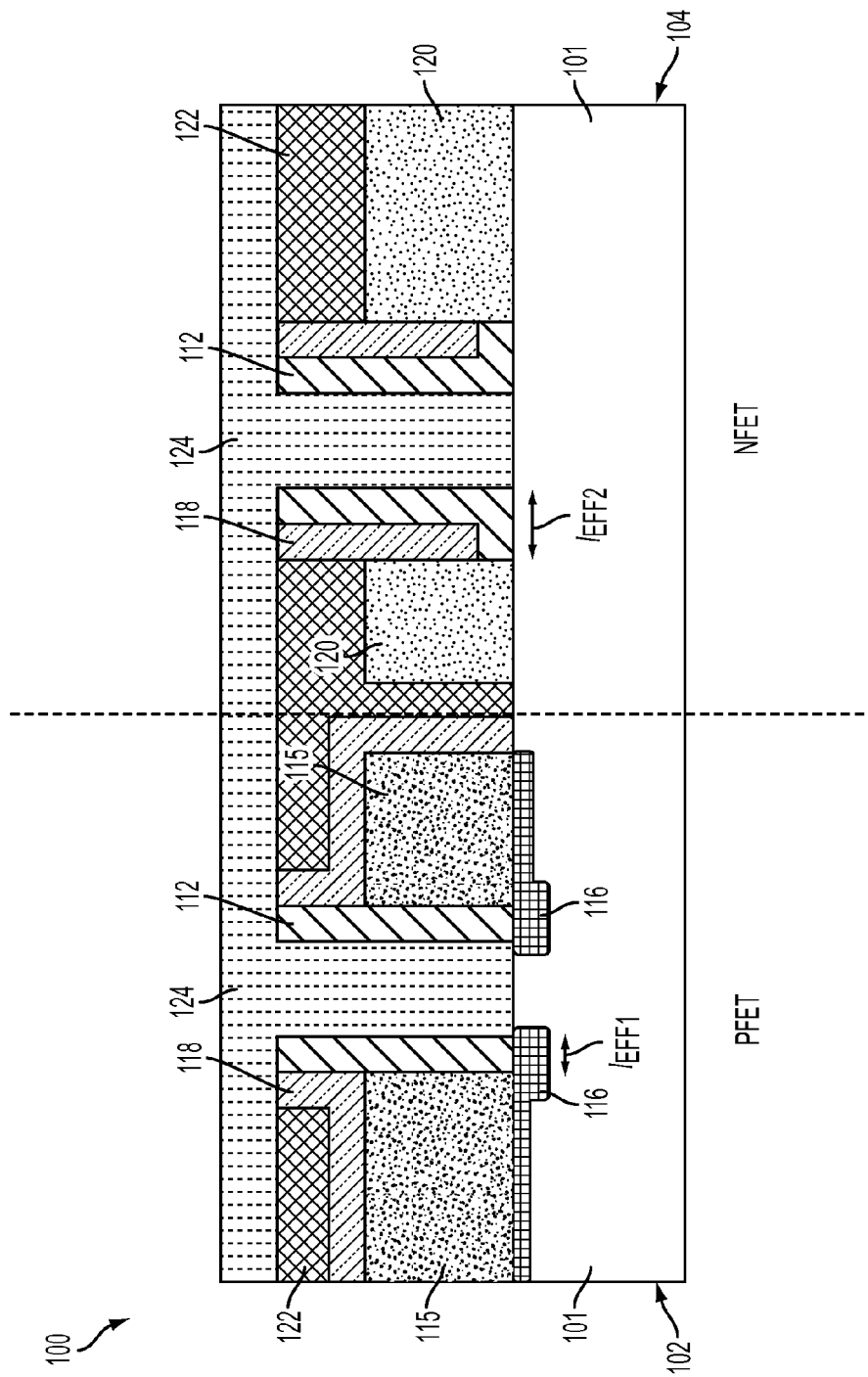
FIG. 11 illustrates the semiconductor device of FIG. 10 following deposition of a block masking layer in the first and second voids.
Figure 12:
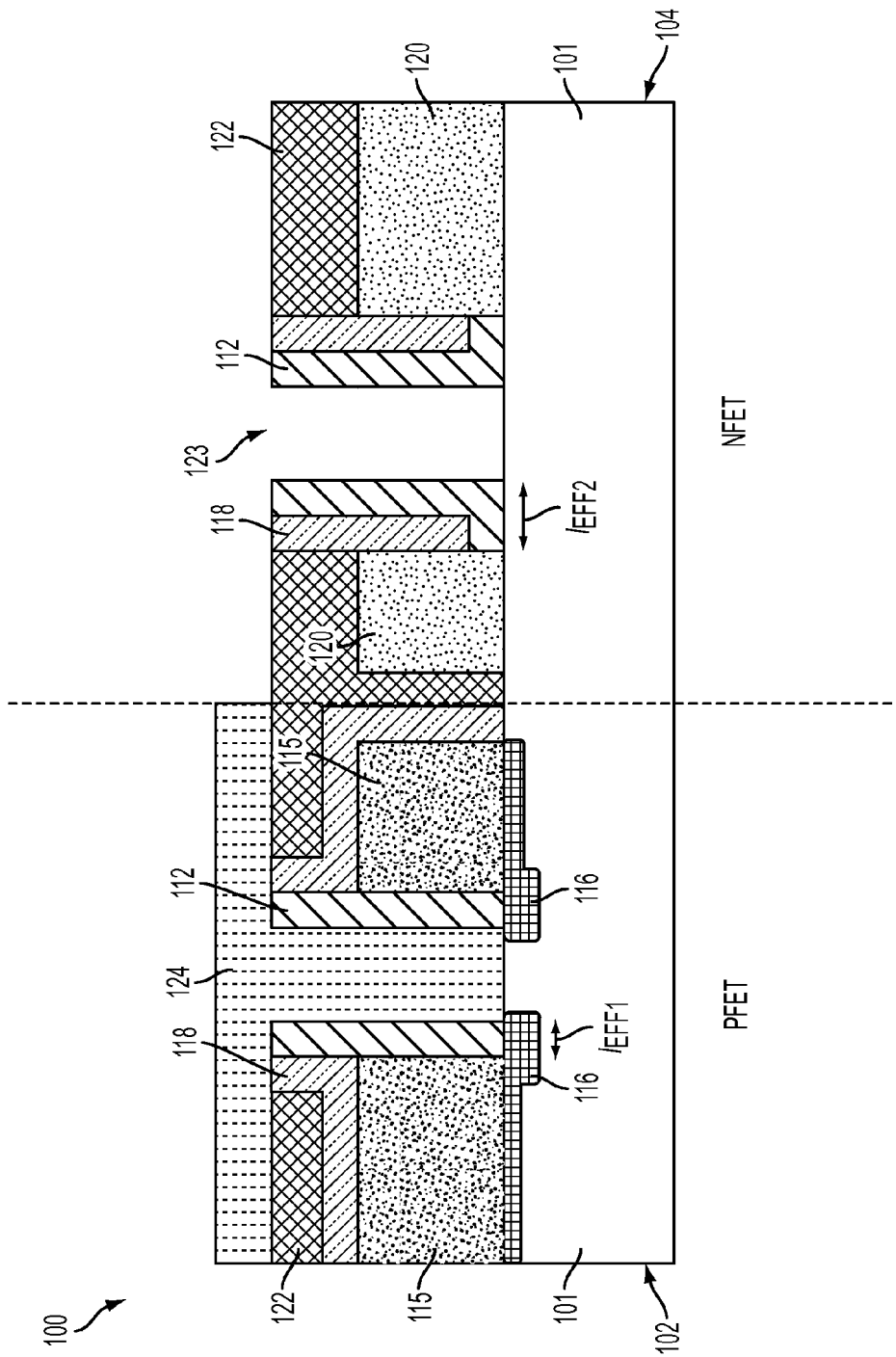
FIG. 12 illustrate the semiconductor device of FIG. 11 following patterning of the block masking layer covering the second semiconductor structure to expose the dual spacers.

Turning to FIG. 11, a masking layer 124 may then be deposited over the first semiconductor structure 102 and second semiconductor structure 104, which fills the voids 123. According to at least one exemplary embodiment, the masking layer 124 may be selectively patterned to expose the second semiconductor structure 104, while covering the first semiconductor structure 102 as illustrated in FIG. 12. It is appreciated, however, that the masking layer 124 may be selectively deposited on only the first semiconductor structure 102, while leaving the second semiconductor structure 104 exposed as understood by those ordinarily skilled in the art. The masking layer 124 is configured to protect the spacers 112 (i.e., the first spacer layer 112) of the first gate stack 106 during an ion deposition process applied to the second semiconductor structure 104. The ion deposition process is performed to adjust the width of the dual-spacer layer 119, as discussed in greater detail below. The masking layer 124 may be formed from various materials include, but not limited to, a photolithography masking material and a hardmask nitride material.

Figure 13A:
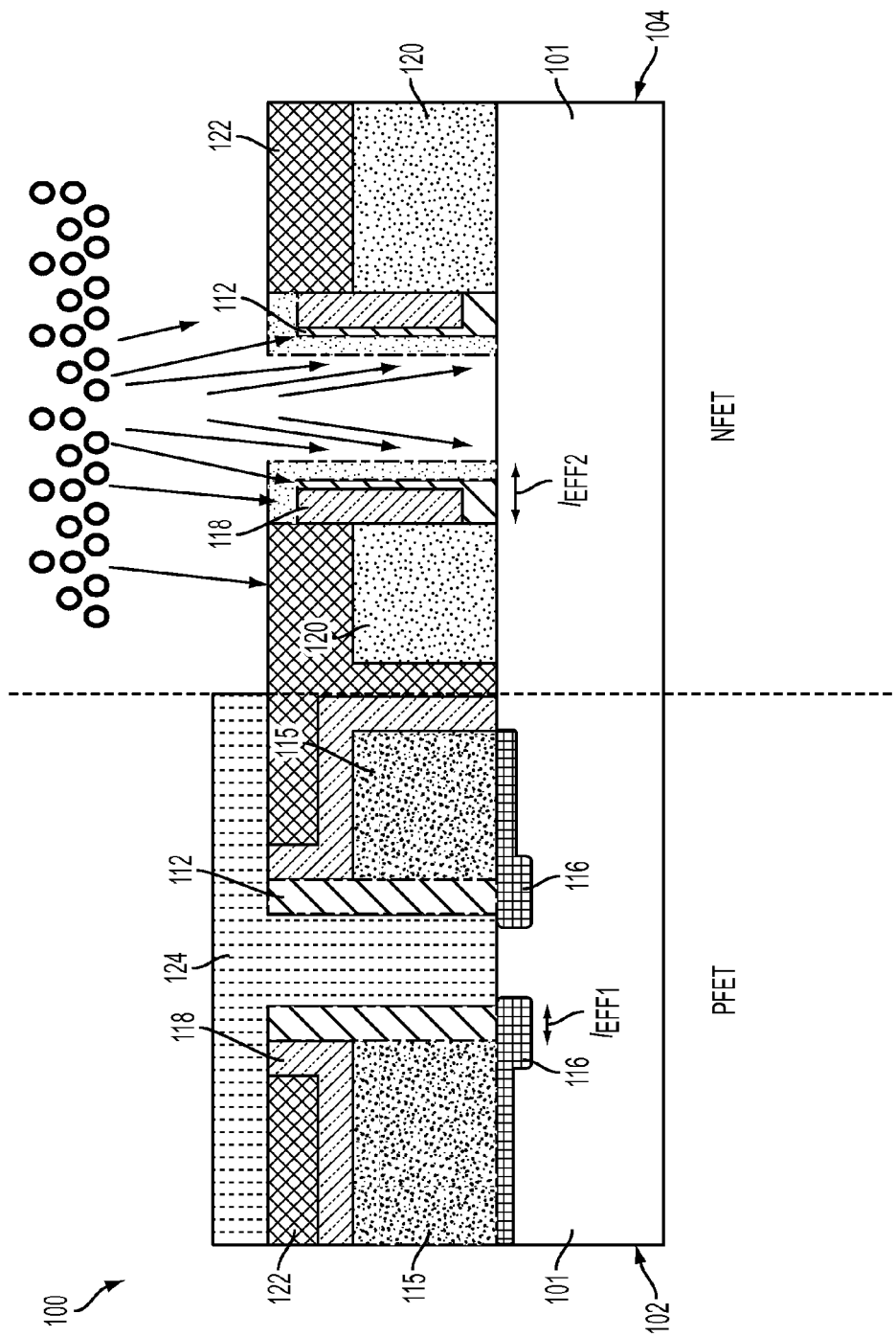
FIGS. 13A-13B illustrate the semiconductor device of FIG. 12 undergoing an ion bombardment process that amorphizes the dual-spacers of the second semiconductor structure to adjust the width of the dual-spacers.

Referring now to FIG. 13, a heavy ion bombardment process is applied to the exposed dual-spacer layer 119 of the second semiconductor structure 104. The ions may be selected from a group comprising germanium (Ge), xenon (Xe), and silicon (Si). The ions may be sputtered and implanted at angles to increase the precision at which the ions are applied to the dual-spacer layer 119. A silicon oxide (SiO$_2$) layer (not indicated) may be deposited on the semiconductor device 100 to protect one or more fins (not indicated) from being damaged by the ion bombardment process.

The ions amorphosize and break the bonding structure of the spacers. An etching process, such as a wet etch for example, may be applied to the amorphized dual-spacer layer 110. As a result, the weakened material is more easily removed than compared to non-amorphized material such that the thickness of the exposed dual-spacer layer 119 is adjusted. Accordingly, the removal of material from the first spacer layer 112 reduces the overall width of the dual-spacer layer 119 and defines a new effective S/D distance (Leff$_2$). The removal of material (i.e., the first spacer layer 112) from the dual-spacer layer 119 also increases the gate length of the second gate stack. Accordingly, $l_{GATE2}$ is greater than $l_{GATE1}$ after performing the ion bombardment. The bombardment of ions also reduces the height of the exposed dual-spacer layer 119. Accordingly, the height of the dual-spacer layer 119 corresponding to the second semiconductor structure 104 is less than the height of the dual-spacer layer 119 corresponding to the first semiconductor structure 102.

Figure 13B:
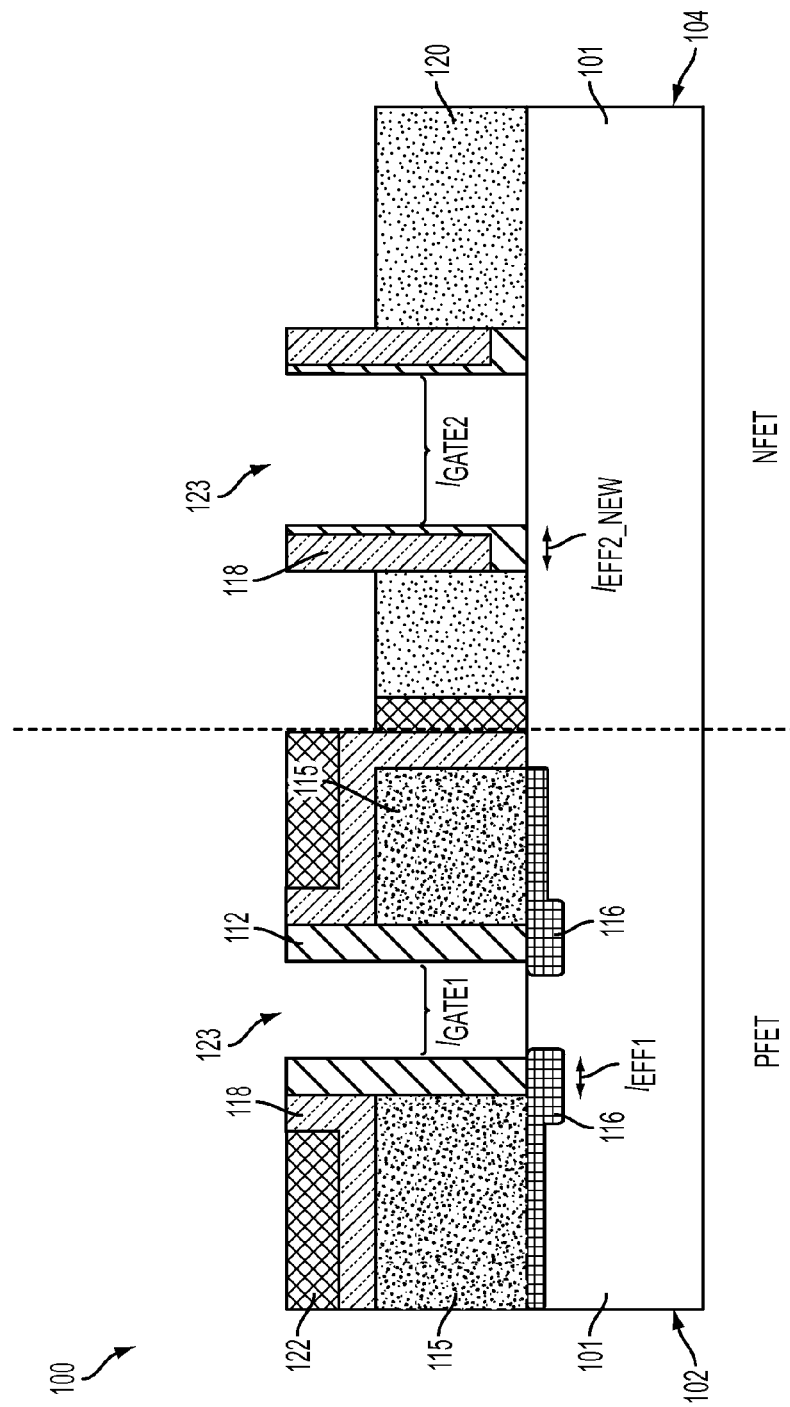

The voltage, energy and/or time of the ion bombardment may be adjusted such that the thickness of the exposed dual-spacer layer 119 of the second semiconductor structure 104 matches the thickness of the first spacer layer 112 of the first semiconductor structure 102, as illustrated in FIG. 13B. By matching the thickness of the adjusted dual-spacer layer 119 with the thickness of the first spacer layer 112, the Leff$_{2\_NEW}$ of the second semiconductor structure 104 may be matched to Leff$_1$ of the first semiconductor structure 102.

Figure 14:
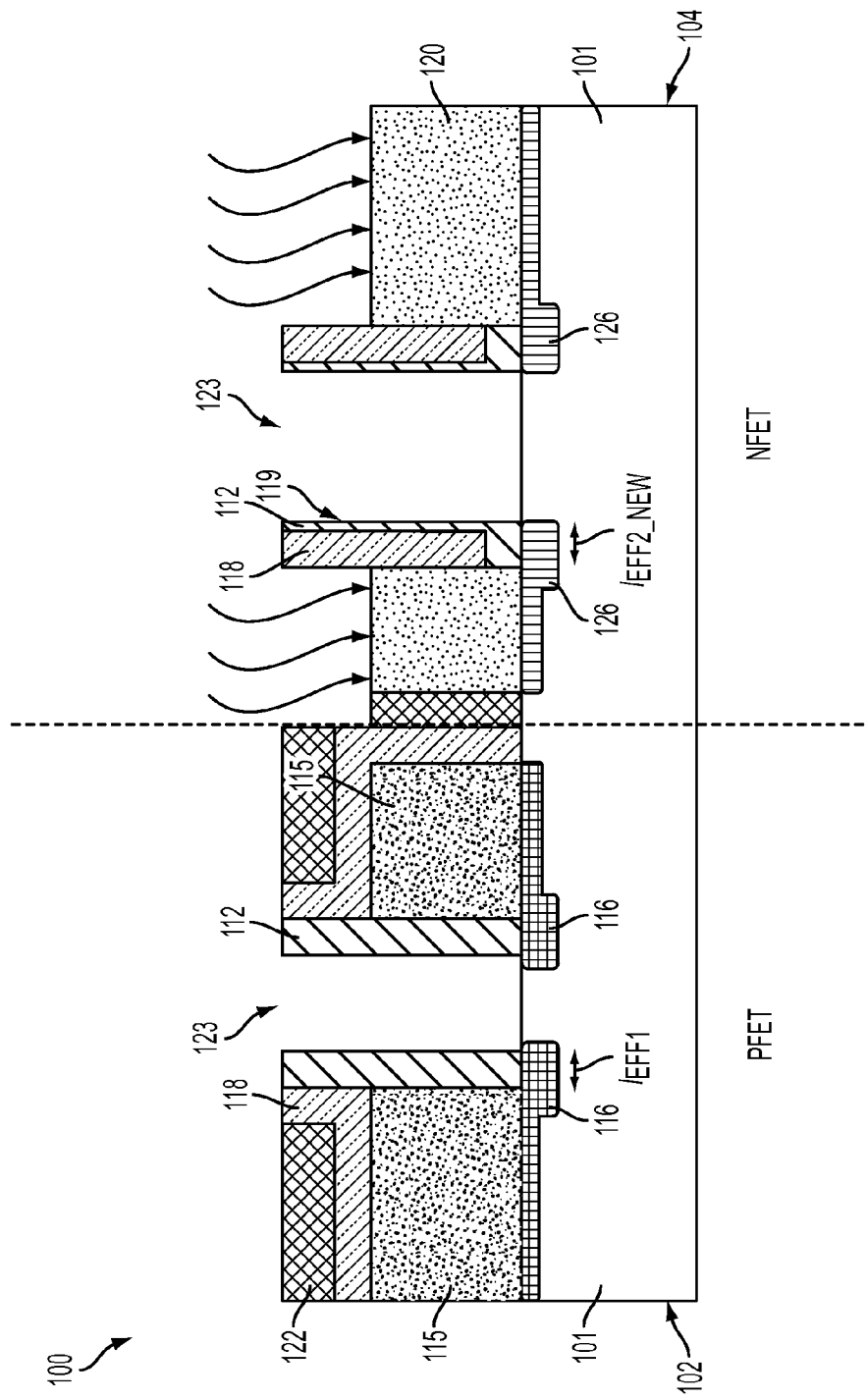
FIG. 14 illustrates the semiconductor device of FIG. 13B showing an annealing process applied to the second epitaxial structures that diffuses ions into the substrate to form second extension overlaps being uniform with the first extension overlaps.

Turning to FIG. 14, the masking layer 124 is removed from the second semiconductor structure 104 and an anneal operation is applied to the second epi structures 120. As described above, the anneal operation causes the dopant of the second epi structures 120 to diffuse through the substrate 101 and into the respective gate channel region corresponding to the second gate stack 108. Although not shown, the dual spacers 119 may undergo a diluted hydro-fluoric (DHF) process. The DHF process may, for example, remove damaged residual portions from the dual spacer 119 caused by the ion bombardment process.

As illustrated in FIG. 14, second S/D junction overlaps 126 are formed beneath the second epi structure 120 and the adjusted dual-spacer layer 119 to overlap the second gate stack 108. The second junction overlaps 126 are configured to control resistance (e.g., reduce resistance) between the gate channel of the second semiconductor structure 104 and the respective elevated S/D regions formed by the second epi structures 120. Since the thicknesses of the first spacers 112 and the dual spacers 119 are equivalent such that Leff$_1$ matches Leff$_{2\_NEW}$, the dimensions of the first S/D junction overlaps 116 match the dimensions of the second S/D junction overlaps 126. Accordingly, underlapped S/D junction extensions resulting from dual epitaxial S/D junction formation processes may be prevented.

Figure 15:
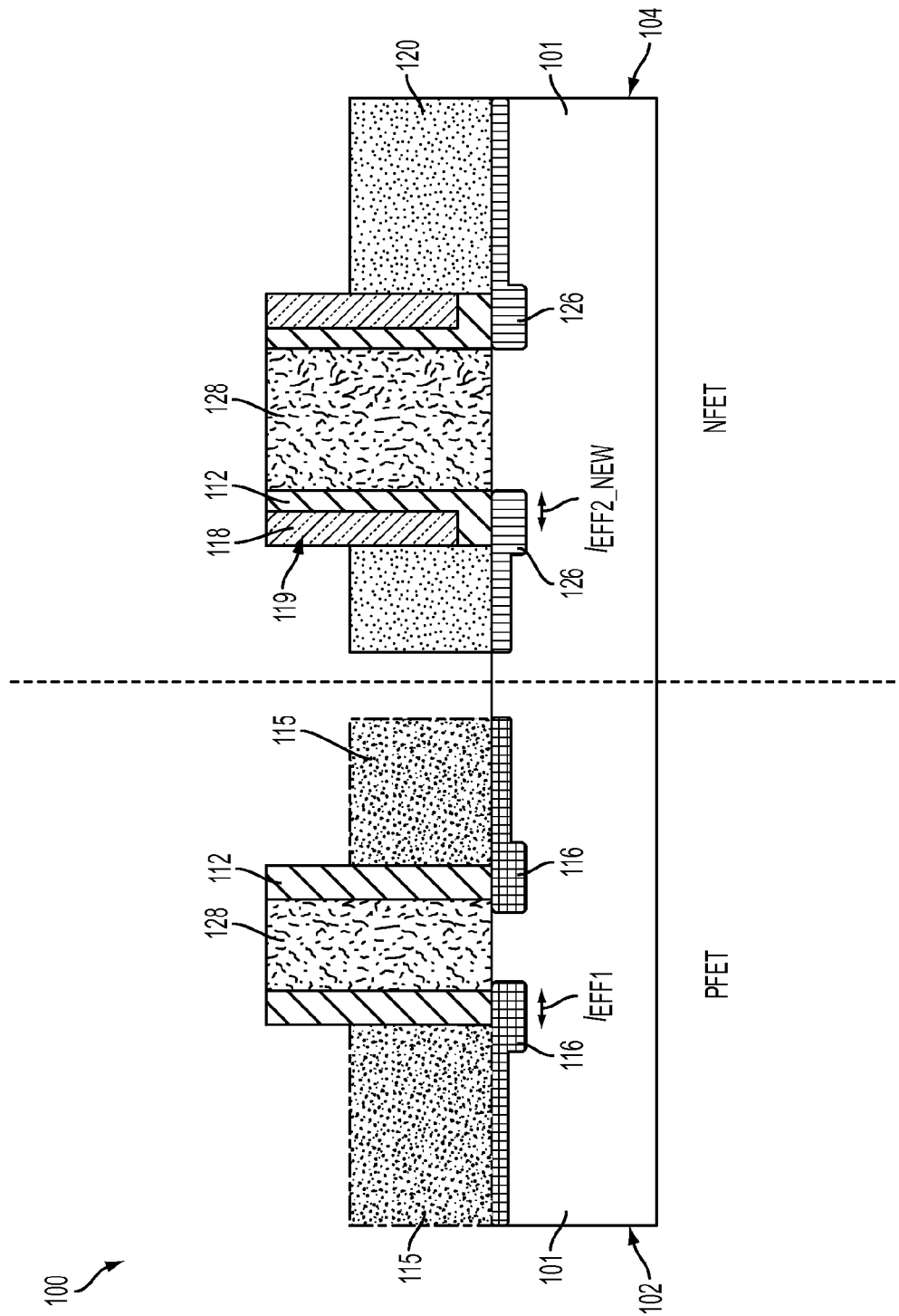
FIG. 15 illustrates the semiconductor device of FIG. 14 following a replacement metal gate process that forms a high dielectric gate structure in the first and second voids of the first and second semiconductor structures.

Turning to FIG. 15, a multi-gate semiconductor device 100 is illustrated following a replacement metal-gate process as understood by those of ordinary skill in art. The replacement metal-gate forms a high-dielectric (high-k) gate 128 in the voids 123 of the respective first and second gate stacks 106, 108. Upon completing the process flow described above, the multi-gate semiconductor device 100 according to at least one exemplary embodiment includes a second gate stack 108 having a gate length ($l_{GATE2}$) that is greater than the gate length ($l_{GATE1}$) of the first gate stack 106. Further, the dual spacers 119 are amorphized due the ion bombardment process, as opposed to the first spacers 112 which are not amorphized. In addition, the first S/D junction overlaps 116 formed beneath the first gate stack 106 are uniform with respect to the second source/drain junction overlaps 126 formed beneath the second gate stack 108 due to matching the widths of the first spacers 112 and the dual spacers 119.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a multigate semiconductor device, the method comprising:
    forming a first semiconductor structure on a semiconductor substrate, the first semiconductor structure including a first dummy gate and first spacers having a first spacer width;
    forming a second semiconductor structure on the semiconductor substrate, the second semiconductor structure including a second dummy gate and second spacers having a second spacer width that is greater than the first spacer width; and
    selectively etching the second spacers to reduce the second spacer width such that a second gate width of the second semiconductor structure is increased.

2. The method of claim 1, wherein selectively etching the second spacers results in the second spacer width matching the first spacer width.

3. The method of claim 2, wherein the selectively etching the second spacers results in the gate width of the second semiconductor structure being greater than a gate width of the first semiconductor structure.

4. The method of claim 3, wherein the selectively etching the second semiconductor structure includes;
    depositing an oxide layer on the semiconductor substrate to cover first elevated source/drain regions corresponding to the first semiconductor structure and second elevated source/drain regions corresponding to the second semiconductor structure;
    exposing the first spacers corresponding to a first gate stack of the first semiconductor structure and exposing second spacers corresponding to a second gate stack of the second semiconductor structure;
    covering the first spacers with a protective masking layer; and
    amorphizing the second spacers such that the second spacer width is reduced.

5. The method of claim 4, wherein the amorphizing the second spacers includes bombarding the second spacers with ions selected from group comprising germanium, xenon and silicon.

6. The method of claim 5, further comprising applying diluted hydro-fluoric (DHF) to remove damaged residual portions from the reduced second spacers.

7. The method of claim 6, wherein the exposing the first and second spacers comprises removing a first dummy gate structure from the first gate stack to form a void that exposes the first spacers, and removing a second dummy gate structure from the second gate stack to form a second void that exposes the second spacers.

8. The method of claim 7 wherein the forming a first semiconductor structure and the forming a second semiconductor structure comprises:
    forming the first gate stack having a first gate length;
    forming the first spacers having a first spacer width on sidewalls of the first gate stack;
    epitaxially growing the first elevated source/drain regions from the semiconductor substrate such that the first elevated source/drain regions abut the first spacers, the first spacers separating the first elevated source/drain regions away from first gate stack by a first effective source/drain distance;
    forming the second gate stack having the second gate length;
    forming the second spacers having a second spacer width on sidewalls of the second gate stack; and
    epitaxially growing the second elevated source/drain regions from the semiconductor substrate such that second elevated source/drain regions abut the second spacers, the second spacers separating the second elevated source/drain regions away from the second gate stack by a second effective source/drain distance that is different from the first effective source/drain distance.

9. The method of claim 8, wherein the first elevated source/drain regions are formed from a first epitaxial material and the second elevated source/drain regions are formed from a second epitaxial material different from the first epitaxial material.

10. A multi-gate semiconductor device, comprising:
    a first semiconductor structure including a first gate stack having first spacers formed on opposing sides thereof;
    a second semiconductor structure including a second gate stack having second spacers formed on opposing sides thereof, the second gate stack having a second gate length that is greater than a first gate length of the first gate stack;
    first elevated source/drain regions abutting the first spacers to define a first effective S/D distance between the first gate stack and the first elevated source/drain regions; and
    second elevated source/drain regions abutting the second spacers to define a second effective S/D distance between the second gate stack and the second elevated source/drain regions, the second effective S/D distance being equal to the first effective S/D distance.

11. The multi-gate semiconductor device of claim 10, wherein the second spacers have a second spacer width that is equivalent to the first spacer width.

12. The multi-gate semiconductor device of claim 11, wherein the first elevated source/drain regions are formed from a first epitaxial material, and the second elevated source/ drain regions are formed from a second epitaxial material different from the first epitaxial material.

13. The multi-gate semiconductor device of claim 12, wherein the second spacers are amorphized, and the first spacers are not amorphized.

14. The multi-gate semiconductor device of claim 13, wherein the first spacers comprise a single layer, and the second spacers comprise a plurality of layers.

15. The multi-gate semiconductor device of claim 14, further comprising:
   first source/drain junction overlaps formed beneath the first elevated source/drain regions, the first source drain junction extending beneath the first spacers and overlapping the first gate stack; and
   second source/drain junction overlaps formed beneath the second elevated source/drain regions, the second source drain junction extending beneath the second spacers and overlapping the second gate stack.

16. The multigate semiconductor device of claim 15, wherein the first source/drain junction overlaps the second source/drain overlaps are uniform with respect to one another.

* * * * *